United States Patent [19]
Wodnicki et al.

[11] Patent Number: 6,037,821
[45] Date of Patent: Mar. 14, 2000

[54] DIGITAL PROGRAMMABLE CLOCK GENERATOR WITH IMPROVED ACCURACY

[75] Inventors: Robert Gideon Wodnicki, Schenectady; Paul Andrew Frank, Albany; Daniel David Harrison, Delanson; Donald Thomas McGrath, Scotia, all of N.Y.

[73] Assignee: General Electric Company, Schenectady, N.Y.

[21] Appl. No.: 09/089,099

[22] Filed: May 28, 1998

[51] Int. Cl.⁷ ...................................................... H03K 1/04
[52] U.S. Cl. ........................ 327/295; 327/258; 340/146.2
[58] Field of Search .................... 327/295, 258; 340/146.2

[56] References Cited

U.S. PATENT DOCUMENTS

| | | |
|---|---|---|
| 3,961,269 | 6/1976 | Alvarez, Jr. ................................ 328/62 |
| 4,516,861 | 5/1985 | Frew et al. ................................ 368/120 |
| 4,561,337 | 12/1985 | Wachi ........................................ 84/1.01 |
| 4,568,841 | 2/1986 | Mayhew .................................... 307/265 |
| 4,785,428 | 11/1988 | Bajwa et al. .............................. 365/233 |
| 5,173,815 | 12/1992 | Iwaki et al. ................................ 360/54 |
| 5,289,116 | 2/1994 | Kurita et al. ............................. 324/158 |
| 5,332,931 | 7/1994 | Crispie et al. ........................... 307/355 |
| 5,394,541 | 2/1995 | Chesley et al. ........................... 395/550 |
| 5,554,946 | 9/1996 | Curran et al. ............................ 327/172 |
| 5,563,533 | 10/1996 | Cave et al. ................................. 327/67 |
| 5,568,075 | 10/1996 | Curran et al. ............................ 327/172 |
| 5,661,440 | 8/1997 | Osaka ......................................... 331/16 |
| 5,731,843 | 3/1998 | Cappels .................................... 348/537 |

Primary Examiner—Toan Tran
Assistant Examiner—Anh-Quan Tra
Attorney, Agent, or Firm—Jill M. Breedlove; Douglas E. Stoner

[57] ABSTRACT

A programmable clock circuit generates a plurality of phase clock signals in correspondence with an associated control word programmed into a memory. Programmable clock circuit is implemented digitally in an application specific integrated circuit. Each phase clock signal is synchronized by a master clock signal which reduces signal jitter and improves phase signal accuracy.

19 Claims, 4 Drawing Sheets

DIGITAL PROGRAMMABLE CLOCK GENERATOR WITH IMPROVED ACCURACY

RELATED APPLICATIONS AND PATENTS

U.S. patent application Ser. No. 09/089,604, entitled "Apparatus and Method for a High Frequency Clocked Comparator and Apparatus for Multi-phase Programmable Clock Generator," filed on Jun. 2, 1998, and assigned to the assignee of the present invention, herein incorporated by reference.

BACKGROUND OF THE INVENTION

This invention relates to an improved method and apparatus for generating programmable timing signals. More particularly, this invention relates to a digital system and method for generating precisely positioned timing signals independent of system component variations due to manufacturing process variations or temperature variations and independently of clock edge location.

The proliferation of large scale integrated (LSI) and very large scale integrated (VLSI) circuits result in an ever increasing use of electronic functions within the integrated circuit. Accordingly, testing devices utilized to evaluate these electronic functions have an increasing burden to evaluate multiple functions, and as such, must be versatile and must accurately perform multiple test functions at high speed. The signal generator is an integral part of the testing device. Such a test device requires a re-configurable and accurate signal generator which has the capability of generating several master clock signals simultaneously.

Historically, signal generators have utilized resistor-capacitor (RC) networks to establish master clock signal frequencies. These analog based frequency generators are very sensitive to resistance value changes over temperature, and to parasitic capacitance. Additionally, manufacturing variability may affect RC values. For example, digital clock circuits may employ inverters in series to establish an operating frequency. These inverter circuits are affected by parasitic capacitance between respective inverters and also changes in output impedance of each respective inverter; both of these factors affect the frequency of the generated master clock signal. As such, digital circuits may be subject to the same temperature and manufacture variability as analog based systems. It is thus desirable the have a programmable clock circuit that functions independently of manufacturing variability and temperature.

Historically, programmable clock circuits have used external clock references, wherein the clock reference may be sensitive to noise and thus result in output master clock signal jitter as noise is detected in the circuit. It is desirable to employ a signal generating circuit that utilizes an external clock reference but is not susceptible to external noise.

SUMMARY OF THE INVENTION

The present invention provides a clock circuit that generates a plurality of programmable timing signals. The programmable clock circuit has the following components: a master clock signal, a memory block, a time counter, a comparator, and a phase clock driver. The memory block has the capability of storing a predetermined number of control words. The time counter is coupled to the master clock signal and generates a temporal count signal in correspondence with the master clock signal. The comparator is coupled to the memory block and also coupled to the time counter and generates a phase transition signal in correspondence with a match between the master clock signal and the control word. Finally, the phase clock driver is coupled to the comparator and coupled to the memory block and generates at least one phase clock signal in correspondence with a respective phase transition signal and a respective control word.

The present invention also provides a method of generating a plurality of synchronized phase clock signals. The method comprises the following steps: storing at least one control word having a transition time in a memory block; generating a master clock signal; generating a temporal count signal; comparing the respective transition time to the count signal to determined when a match occurs; next, generating a phase transition signal in correspondence with a match between the transition time, and the count signal; finally, generating a transition in at least one phase clock signal in correspondence with the status of the phase transition signal, the status of the control word, and the negative-going edge of the master clock signal.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
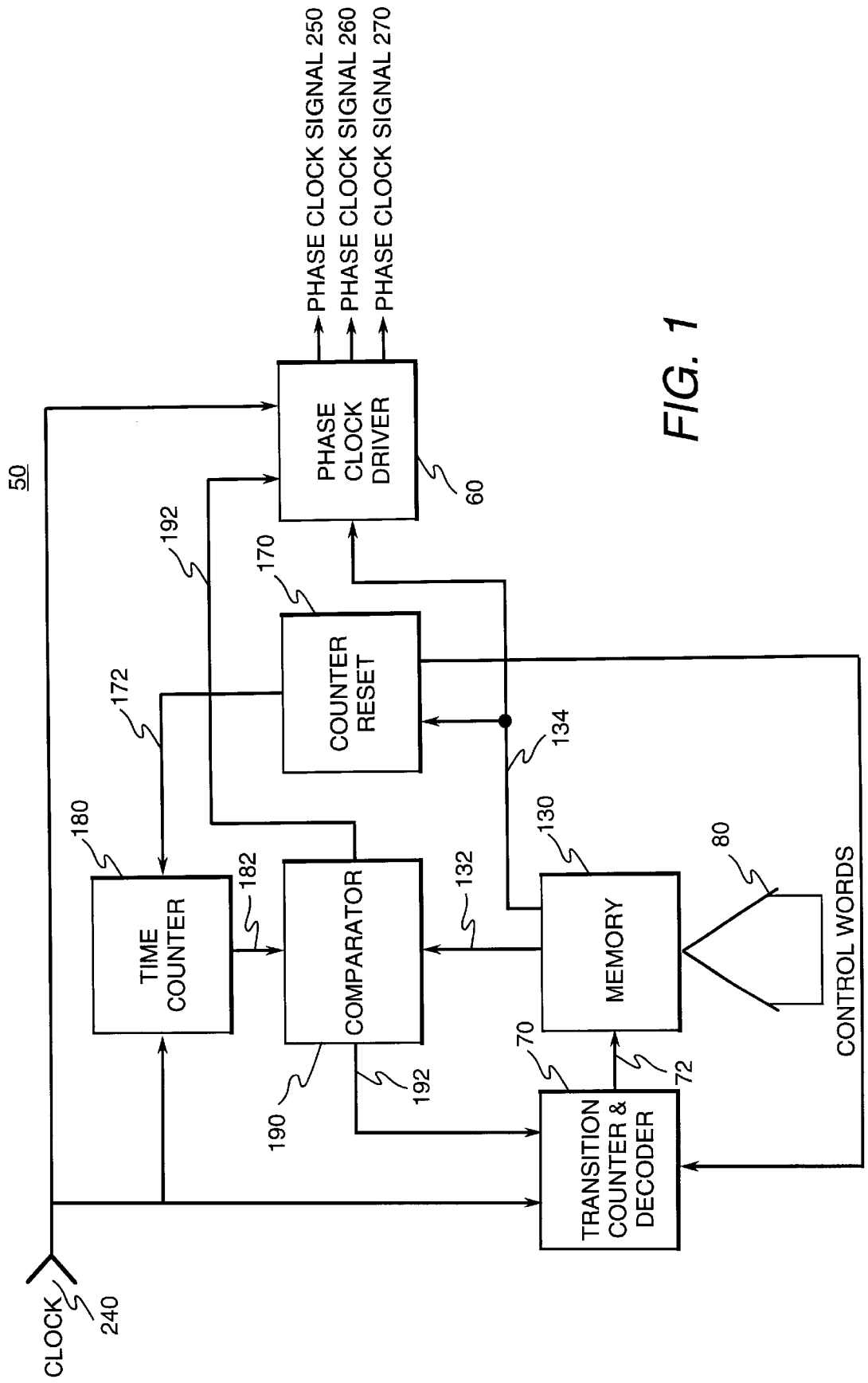
FIG. 1 is a block diagram illustration of the programmable clock circuit of the present invention.

The present invention, as illustrated in FIG. 1, is a programmable clock generator 50, wherein a plurality of phase clock signals 250, 260, and 270 are generated in correspondence with an associated control word programmed into a memory block 130. Programmable clock circuit 50 may be implemented digitally in an application specific integrated circuit (ASIC) or other digital technology, such as, but not limited to, complementary metal-oxide-semiconductor (CMOS), metal-oxide-semiconductor (MOS), gallium arsenide (GaAs), and silicon germanium (SiGe). Additionally, a master clock signal 240 is usually generated in the ASIC and is consequently not very susceptible to external noise. Each respective phase clock signal 250, 260, and 270 is synchronized by master clock signal 240 which has the effect of minimizing signal jitter and improving phase signal accuracy as is discussed further below.

Figure 2:
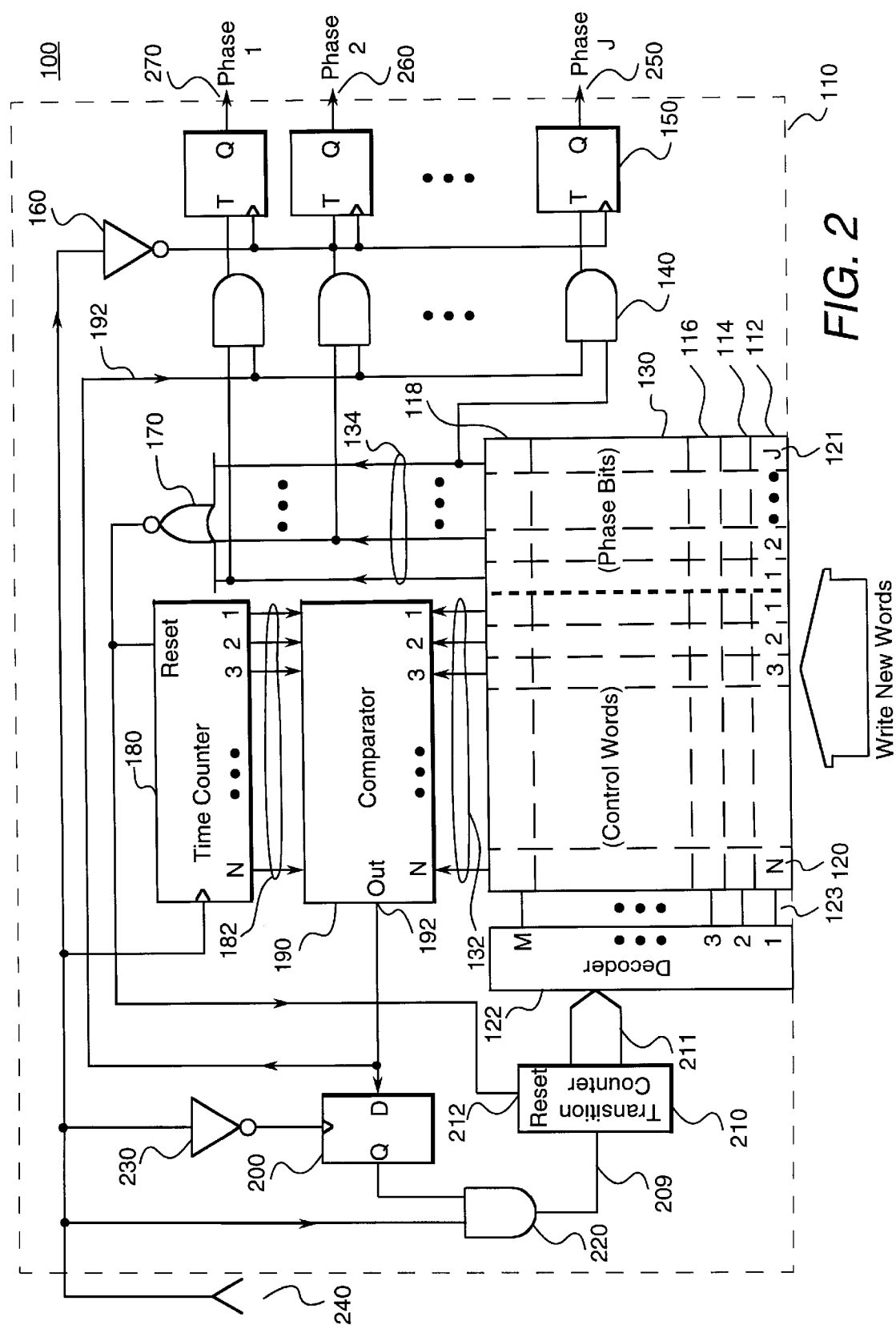
FIG. 2 is an illustration of a detailed presentation of the programmable clock circuit shown in FIG. 1.

Programmable clock circuit 50 comprises the following elements: memory block 130, a comparator 190, a time counter 180, a counter reset 170, a phase clock driver 60, a transition counter and decoder 70, and generates a respective phase clock signal 250, 260, and 270, as illustrated in FIG. 1. A plurality of control words 80 typically are programmed into memory block 130 for use by programmable clock generator 50. Memory block 130 may comprise read only memory, random access memory, dynamic random access memory, flash erasable and programmable read only memory, and electronically erasable and programmable read only memory. Memory block 130 stores a plurality of control words. Each control word 80 comprises a transition count 132 and respective associated phase bits 134. Each transition count 132 comprises "n" bits where "n" defines the number of bits that comprise a time count signal 182. Control word 80 also comprises phase bits one to "J", where phase bit one is associated with phase control signal 1, phase bit two is associated with phase control signal 2, and phase bit "J" is associated with phase control signal "J", as is illustrated in FIG. 2. When a phase bit is set to an active state, the associated phase master clock signal transitions to the opposite state, as is further discussed below.

Time counter 180 is an "n" bit counter which incrementally counts from 1 to "$2^n$" based on master clock signal 240. Upon the temporal progression of each clock cycle of master clock signal 240 time counter 180 increments time count signal 182 by a count of one. Time counter 180 may increment time count signal 182 based on the decimal integer, the binary coded decimal (BCD) integer, the gray code, or any counting approach suitable for incrementing a digital signal.

Comparator 190 compares time counter signal 182 and transition count 132, and when a match occurs comparator 190 generates a phase transition signal 192.

Transition counter and decoder 70 is adapted to select the control word stored in memory block 130 that defines a respective phase clock signal 250, 260, or 270. Transition counter and decoder 70 generates a control word decode signal 72 which is utilized to identify control word 80, as illustrated in FIG. 1. Control word decode signal 72 selects a respective control word. Transition counter and decoder 70 makes the control word selection based on the transition of transition signal 192 and the clock cycle of master clock signal 240. A respective control word is selected on a sequential basis (i.e. identifies a first control word, then a second control word, up to and including a final control word).

Phase clock driver 60 provides driver means necessary to drive each respective phase clock signal 250, 260, and 270. Phase clock driver 60 generates a transition in a respective phase master clock signal 250, 260, and 270 after receiving each of phase transition signal 192, phase bit signal 134, and master clock signal 240. Phase clock signals 250, 260, and 270 are adapted to transition either from inactive to active or from active to inactive. Driver means for each phase clock signal 250, 260, or 270 may include but is not limited to the buffered output of a latching gate, a transistor output, or an operational amplifier output.

Finally, counter reset 170 generates a counter reset signal 172 upon the detection of a reset code detected in the control word. Counter reset signal 172 reinitializes time counter 180 and transition counter and decoder 70. After re-initialization, time counter 80 and transition counter and decoder 70 begin to increment time counter signal 182 and control word decode signal 72 from zero to "$2^{n-1}$" based on master clock signal 240.

Programmable clock circuit 50 shown in FIG. 1 is further illustrated by clock circuit 100 shown in FIG. 2.

Memory block 130 is programmed to comprise a plurality of control words. For example, memory block 130 comprises "m" control words beginning with control word 112 and continuing through control word 118. The value "m" is defined as a sufficient number of control words to identify positive going and negative going transitions for each respective phase clock signal 250, 260, and 270. Each control word comprises phase bits 134 and transition count signal 132, as illustrated in Table 1. Transition count signal 132 couples transition count word 312 up to and including transition count word 320 to comparator 190. Each respective phase bit 134 is coupled to reset "NOR" gate 170 and coupled to a respective phase clock gate 140. Upon the detection of the reset code in phase bits 132 reset "NOR" gate 170 generates a counter reset signal 212. Reset "NOR" gate is currently configured to generate a counter reset signal 212 when all phase bits 134 are zero. The reset code is typically associated with the last control word programmed into memory because it defines the periodicity of the waveforms generated by programmable clock circuit 100. It is, however, noted that for a non-repeating set of programmed master clock signals all transitions may be programmed into memory. This objective can be accomplished by not programming a reset code into memory block 130, but rather programming other control words.

Figure 3:
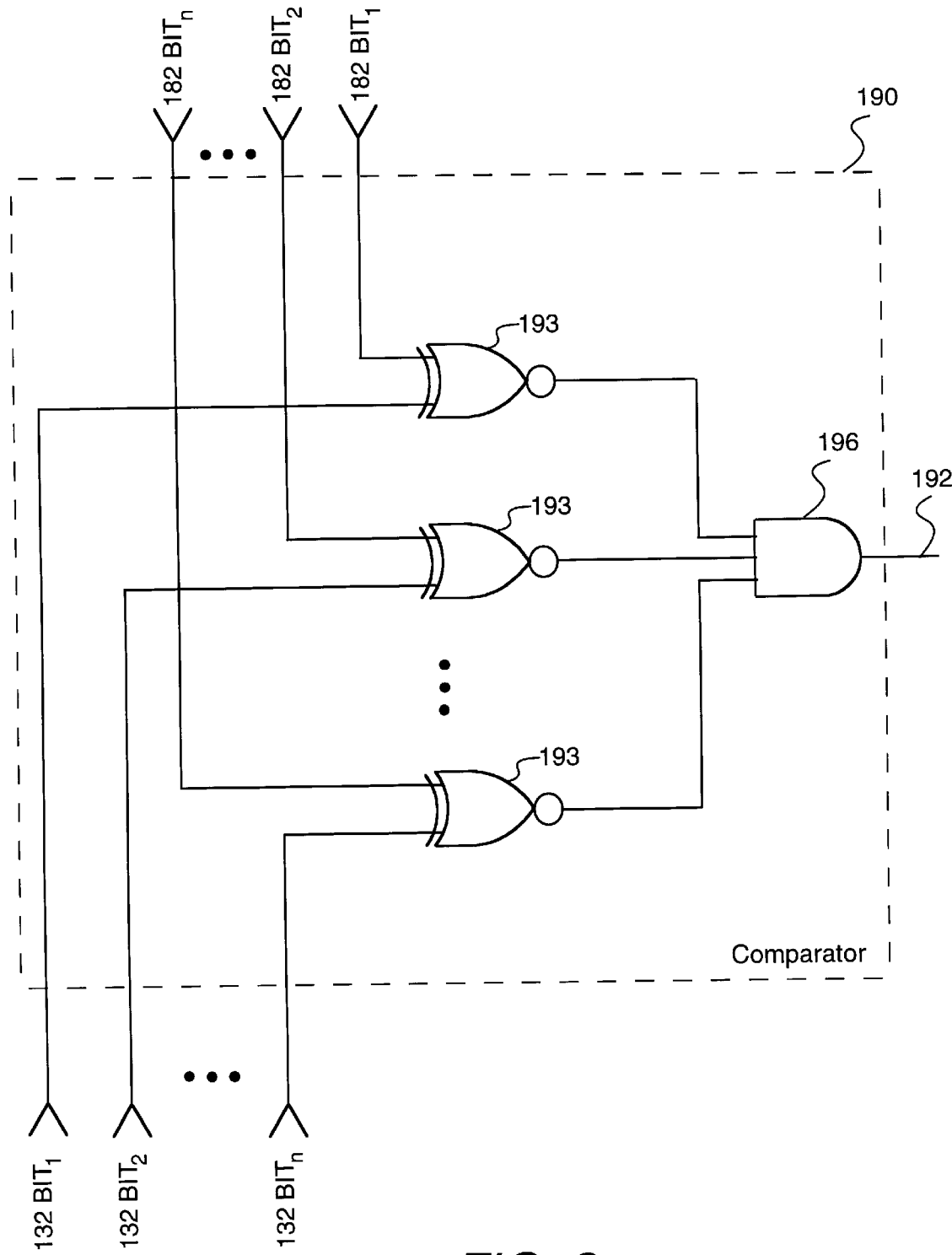
FIG. 3 is an illustration of the comparator shown in FIG. 2.

Comparator 190 compares transition count signal 132 to time count signal 182 and generates phase transition signal 192 when a match occurs. A match is defined as the condition in which time count signal 182 has the same numerical value as transition count signal 132, as is described in greater detail below. FIG. 3 illustrates further detail of comparator 190. Each respective bit of transition count signal 132 is exclusive "NOR'd" with a respective bit of time count signal 182. Exclusive "NOR" gate 193 compares a respective bit of transition count signal 132 with a respective bit of time count signal 182 and generates a match signal when both of the compared bits are the same, that is, both bits are one and alternatively both bits are zero. As illustrated in FIG. 3, each respective bit of transition count signal 132 and time count signal 182 is coupled to a respective exclusive "NOR" gate 193, as such, there are "n" exclusive "NOR" gates 193 in comparator 190. When all respective exclusive "NOR" gates 193 simultaneously generate an active signal "AND" gate 196 generates phase transition signal 192. Consequently, whenever there is a match between time count signal 182 and transition count signal 132, "AND" gate 196 generates phase transition signal 192.

Phase clock "AND" gate 140 generates a respective phase clock latch signal when phase transition signal transitions to the active state and a respective corresponding phase bit signal 134 is active. Phase clock latch signal correspondingly sets a toggle latch to True on a phase clock latch gate 150. Phase clock latch gate 150 comprises a Toggle-type latch gate. A phase "NOT" gate 160 inverts master clock signal 240, as such, phase clock latch gate 150 generates a transition in respective phase clock signal 250, 260, and 270 upon the negative going edge of master clock signal 240 at any time that toggle latch 150 has been set True.

Phase transition signal 192 is coupled to a transition counter latch gate 200 which comprises a D-type latch gate. Transition counter NOT gate 230 inverts master clock signal 240 to generate a trigger to gate 200. Consequently, gate 200 generates a transition in an increment signal 201 on the negative going edge of master clock signal 240 at any time there has been a transition in phase transition signal 192. A transition "AND" gate 220 is coupled to transition counter 210. Master clock signal 240 and increment signal 201 from gate 200 are coupled to transition "AND" gate 220. "AND" gate 220 generates a counter increment signal 209 when increment signal 201 is active and master clock signal 240 generates a positive-going edge. Counter increment signal 209 is coupled to transition counter 210. Transition counter 210 generates a control word selection signal 211 which is updated each time there is a cycle in clock increment signal 209. A decoder 122 generates a control word decode signal 123 based on control word selection signal 211. Control word decode signal 123 selects a respective control word. FIG. 2, identifies a plurality of control words which may be selected, including 112, 114, 116, through 118, wherein control word 118 is designated control word number "m". Transition counter 210 and decoder 122 identify the next respective control word on the proceeding clock cycle after phase transition signal 192 transitions from active to inactive. Although the gates described herein have been presented to generate signals based on positive logic, they correspondingly may be described so as to generate signals based on negative logic.

TABLE 1

| | ← ("n" bits wide) → | ← PB ("j" bits wide) → | | |
|---|---|---|---|---|
| CW | Transition Count | $PB_1$ | $PB_2$ | $PB_3$ |
| $CW_0$ | Transition Count 312 ($T_0$) | 1 | 1 | 0 |
| $CW_1$ | Transition Count 314 ($T_1$) | 0 | 0 | 1 |
| $CW_2$ | Transition Count 316 ($T_2$) | 1 | 0 | 0 |
| $CW_3$ | Transition Count 318 ($T_3$) | 0 | 1 | 0 |
| $CW_4$ | Transition Count 320 ($T_4$) | 0 | 0 | 1 |
| $CW_5$ | Transition Count 322 ($T_5$) | 0 | 0 | 0 | reset code |

Key
CW = Control word
Tm = Transition count ("n" bits wide)
PB = Phase bits ("J" bits wide)
$PB_1$ > master clock signal 270
$PB_2$ > master clock signal 260
$PB_3$ > master clock signal 250

Figure 4:
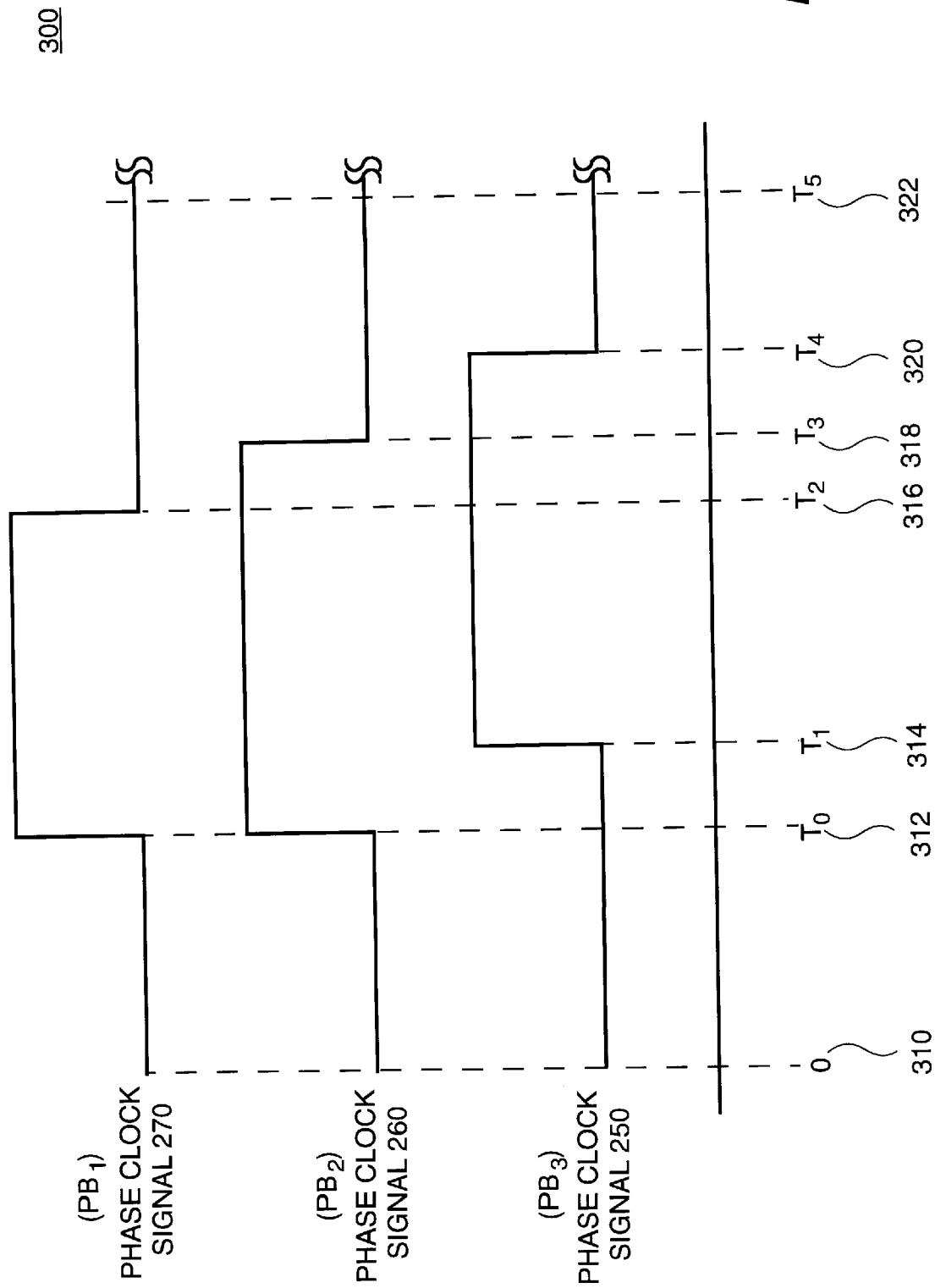
FIG. 4 is an illustration of three respective phase clock signal wave-forms of the present invention.

Table 1 and FIG. 4 illustrate one example of the response of programmable clock circuit 100 to a given set of control words as identified in Table 1. Table 1 comprises six control words beginning with control word zero ($CW_0$) through control word five ($CW_5$). In this example, each control word comprises a transition count and three phase bits ($PB_1$, $PB_2$, and $PB_3$). Transition count 312 is associated with $CW_0$. Transition 314 is associated with $CW_1$ and comprises respective transition count ($T_1$) and phase bits ($PB_1$, $PB_2$, and $PB_3$). Again, by way of example, the three phase bits associated with $CW_0$ include two active phase bits ($PB_1$ and $PB_2$) and one inactive phase bit ($PB_3$); the three phase bits associated with $CW_1$ include two inactive phase bits ($PB_1$ and $PB_2$) and one active phase bit ($PB_3$); the three phase bits associated with $CW_2$ include two inactive phase bits ($PB_2$ and $PB_3$) and one active phase bit ($PB_1$); the three phase bits associated with $CW_3$ include two inactive phase bits ($PB_1$ and $PB_3$) and one active phase bit ($PB_2$); the three phase bits associated with $CW_4$ include two inactive phase bits ($PB_1$ and $PB_2$) and one active phase bit ($PB_3$); and finally, the three phase bits associated with $CW_5$ include three inactive phase bits ($PB_1$, $PB_2$, and $PB_3$).

FIG. 4 illustrates the three respective phase clock signals associated with example data in Table 1. PB1 is represented by phase clock signal 270; $PB_2$ is represented by phase clock signal 260; and $PB_3$ is represented by phase clock signal 250, as illustrated in FIG. 4. At time $T_0$ transition count 312 establishes the temporal interval after which $PB_1$ and $PB_2$ generates a transition in phase clock signals 260 and 270, respectively. At time $T_1$ transition count 314 establishes the temporal interval after which $PB_3$ generates a transition in phase clock signal 250. At time $T_2$ transition count 316 establishes the temporal interval after which $PB_1$ generates a transition in phase clock signal 270. At time $T_3$ transition count 318 establishes the temporal interval after which $PB_2$ generates a transition in phase clock signal 260. At time $T_4$ transition count 320 establishes the temporal interval after which $PB_3$ generates a transition in phase clock signal 250. At time $T_5$, transition count 322 comprises reset code "000" corresponding to $PB_1$, $PB_2$, and $PB_3$ all being zero (or False). As such, transition count 322 identifies the temporal interval after which respective phase clock signals 250, 260, and 270 identified in graph 300, repeat the illustrated waveforms.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A programmable clock circuit comprising:
    a master clock signal having a plurality of clock cycles;
    a memory block adapted to store a plurality of control words;
    a time counter coupled to said master clock signal, wherein said time counter generates a temporal count signal in correspondence with said master clock signal;
    a comparator coupled to said memory block and coupled to said time counter, wherein said comparator generates a phase transition signal in correspondence with a match between said count signal and said control word; and
    a phase clock driver coupled to said comparator and coupled to said memory block, wherein said phase clock driver generates at least one phase clock signal in correspondence with said respective phase transition signal and said respective control word.

2. The programmable clock circuit as recited in claim 1, further comprising a transition counter coupled to said comparator, wherein said transition counter generates a control word selection signal in correspondence with said phase transition signal and said master clock signal.

3. The programmable clock circuit as recited in claim 2, further comprising a decoder coupled to said transition counter, and coupled to said memory block, wherein said decoder generates a control word decode signal in correspondence with said control word selection signal so as to identify a respective control word in said memory block.

4. The programmable clock circuit as recited in claim 1, wherein said respective control word comprises a respective transition count and a respective at least one phase bit.

5. The programmable clock circuit as recited in claim 4, wherein said respective transition count is a respective value associated with the number of clock cycles of said master clock signal before at least one associated phase clock signal transitions from one state to another state.

6. The programmable clock circuit as recited in claim 1, wherein said temporal count signal comprises an incremental count of the number of clock cycles in said master clock signal.

7. The programmable clock circuit as recited in claim 4, wherein each of said at least one phase bits is associated with a respective phase clock signal.

8. The programmable clock circuit as recited in claim 2, further comprising a counter reset coupled to said memory block, wherein said counter reset generates a counter reset signal in correspondence with a reset code stored in a respective one of said plurality of said control words.

9. The programmable clock circuit as recited in claim 8, wherein said transition counter and said time counter is initialized by said counter reset signal.

10. The programmable clock circuit as recited in claim 1, wherein said plurality of control words is selected to be at least one control word for each transition of each respective phase clock signal.

11. The programmable clock circuit as recited in claim 1, wherein said memory block is programmable.

12. The programmable clock circuit as recited in claim 8, wherein said predetermined control word is selected to be the control word in which no at least one phase bit is set.

13. The programmable clock circuit as recited in claim 12 is encapsulated in an application specific integrated circuit (ASIC).

14. A method of generating a plurality of synchronized phase clock signals, said method comprising the steps of:
   storing at least one control word in a memory block, wherein each respective control word comprises a transition time and at least one phase selection bit;
   receiving a master clock signal having a plurality of clock cycles;
   generating a temporal count signal in correspondence with said master clock signal, wherein said count signal is incremented upon the detection of an edge of each clock cycle;
   comparing said respective transition time to said count signal so as to determine when a match occurs;
   generating a phase transition signal in correspondence with a match between said transition time and said count signal; and
   generating a transition in a respective at least one phase clock signal in correspondence with the status of said phase transition signal, and in correspondence with the status of said respective at least one phase selection bit, and in correspondence with the detection of an edge of the clock cycle of said master clock signal.

15. The method as recited in claim 14, further comprising the step of generating a control word selection signal in correspondence with said phase transition signal and said master clock signal.

16. The method as recited in claim 15, further comprising the step of incrementing said control word selection signal in correspondence with the detection of an edge of the clock cycle of said master clock signal and the status of said phase transition signal.

17. The method as recited in claim 16, further comprising the step of selecting a respective control word in correspondence with the decoded status of said control word selection signal.

18. The method as recited in claim 14, further comprising the step of generating a reset signal in correspondence with the detection of a reset code stored in a respective at least one phase selection bit.

19. The method as recited in claim 18, further comprising the step of re-initializing said control word selection signal and said temporal count signal in correspondence with the generation of said reset signal.

* * * * *